(12) United States Patent
Li

(10) Patent No.: US 10,790,313 B2
(45) Date of Patent: Sep. 29, 2020

(54) ARRAY SUBSTRATES, METHODS FOR MANUFACTURING THE SAME, AND DISPLAY SCREENS

(71) Applicant: Kunshan Go-Visionox Opto-Electronics Co., Ltd., Kunshan (CN)

(72) Inventor: Yao Li, Kunshan (CN)

(*) Notice: Subject to any disclaimer, the term of this patent is extended or adjusted under 35 U.S.C. 154(b) by 0 days.

(21) Appl. No.: 16/510,990

(22) Filed: Jul. 15, 2019

(65) Prior Publication Data

US 2019/0341402 A1 Nov. 7, 2019

Related U.S. Application Data

(63) Continuation of application No. PCT/CN2018/092248, filed on Jun. 21, 2018.

(30) Foreign Application Priority Data

Nov. 30, 2017 (CN) .......................... 2017 1 1243938

(51) Int. Cl.
*H01L 27/12* (2006.01)
*H01L 27/32* (2006.01)
*H01L 27/28* (2006.01)

(52) U.S. Cl.
CPC .......... *H01L 27/124* (2013.01); *H01L 27/286* (2013.01); *H01L 27/3276* (2013.01)

(58) Field of Classification Search
None
See application file for complete search history.

(56) References Cited

U.S. PATENT DOCUMENTS 6,337,284 B1 * 1/2002 Hwang ............... H01L 27/1288
438/710
2002/0109811 A1 * 8/2002 Park .................. G02F 1/136227
349/113

(Continued)

FOREIGN PATENT DOCUMENTS

CN 104777654 A 7/2015
CN 104793802 A 7/2015

(Continued)

OTHER PUBLICATIONS

TW First Office Action dated Jun. 28, 2019 in the corresponding TW application (application No. 107126051).

(Continued)

*Primary Examiner* — Herve-Louis Y Assouman
(74) *Attorney, Agent, or Firm* — Kilpatrick Townsend & Stockton

(57) ABSTRACT

The present disclosure relates to an array substrate. The array substrate includes a substrate; an outer connection wiring formed on the substrate. The outer connection wiring includes an outer connection section and a wire changing section located on an inner side of the outer connection section. An inorganic film covers the outer connection wiring. The inorganic film is provided with a via hole configured to expose a part of the wire changing section, and a groove configured to expose the outer connection section. And a metal layer is formed on the inorganic film, the metal layer includes a plurality of metal wirings electrically connected to the wire changing section through the via hole.

18 Claims, 2 Drawing Sheets

(56) References Cited

U.S. PATENT DOCUMENTS

| | | | |
|---|---|---|---|
| 2010/0129528 A1* | 5/2010 | Yamazaki | G02F 1/167 |
| | | | 427/64 |
| 2010/0163284 A1* | 7/2010 | Tanahara | G02F 1/133351 |
| | | | 174/255 |
| 2011/0133215 A1* | 6/2011 | Kang | H01L 27/3279 |
| | | | 257/88 |
| 2017/0033126 A1 | 2/2017 | Miyaguchi | |
| 2017/0102819 A1 | 4/2017 | Hashimoto | |
| 2017/0282286 A1 | 10/2017 | Kin et al. | |

FOREIGN PATENT DOCUMENTS

| | | |
|---|---|---|
| CN | 204613909 U | 9/2015 |
| CN | 106125424 A | 11/2016 |
| CN | 205944094 U | 2/2017 |
| CN | 106502441 A | 3/2017 |
| CN | 107068862 A | 8/2017 |
| CN | 107170776 A | 9/2017 |
| CN | 107241870 A | 10/2017 |
| CN | 206649487 U | 11/2017 |

OTHER PUBLICATIONS

CN First Office Action with Search Report dated Dec. 24, 2019 in the corresponding CN application (application No. 201711243938.6).

Office Action of Chinese Patent Application No. 201711243938.6 dated Jul. 16, 2020.

* cited by examiner

ARRAY SUBSTRATES, METHODS FOR MANUFACTURING THE SAME, AND DISPLAY SCREENS

CROSS REFERENCE TO RELATED APPLICATIONS

This disclosure is a continuation application for International Application PCT/CN2018/092248, filed on Jun. 21, 2018, which claims the priority benefit of Chinese Patent Application No. 201711243938.6, titled "ARRAY SUBSTRATES, METHODS FOR MANUFACTURING THE SAME, AND DISPLAY SCREENS" and filed on Nov. 30, 2017. The entireties of both applications are incorporated by reference herein for all purposes.

TECHNICAL FIELD

The present disclosure relates to the field of display technologies.

BACKGROUND

A display screen may include a display area (i.e., active area (AA area)) and a non-display area (i.e., non-active area (non-AA area)). In order to achieve certain functions, the non-display area may be required to be bendable. For example, in order to achieve a narrow bezel, the non-display area is bent to the back of the screen to reduce the width of the bezel.

SUMMARY

Based on the above, aiming at the problem in prior art that the metal wiring is easy to be broken, it is desirable to provide an array substrate that is not prone to cause metal wiring to be broken.

An array substrate is provided, including: a substrate; an outer connection wiring formed on the substrate; an inorganic film covering the outer connection wiring; a third metal layer formed on the inorganic film. In the above array substrate, the external connection wiring is located on the substrate, and there is no inorganic film located above the outer connection section of the outer connection wiring.

Compared with the case where the entire metal wiring is located on the inorganic film, the outer connection wiring is less squeezed during bending, which is advantageous for reducing the stress of the outer connection wiring and avoiding the breakage of the outer connection wiring. In addition, the outer connection wiring and the metal wiring are connected through a via hole to avoid the risk of disconnection caused by a height difference.

In an exemplary embodiment, the outer connection wiring includes an outer connection section and a wire changing section located on an inner side of the outer connection section. The inorganic film is provided with a via hole exposing a part of the wire changing section, and a groove exposing the outer connection. The third metal layer includes a third metal wiring electrically connected to the wire changing section through the via hole.

In an exemplary embodiment, the array substrate further includes a barrier layer formed between the outer connection wiring and the substrate.

In an exemplary embodiment, the barrier layer includes silicon oxide or silicon nitride or silicon oxynitride.

In an exemplary embodiment, the outer connection wiring has a thickness between 500 nm and 1,000 nm.

In an exemplary embodiment, the barrier layer has a thickness between 80 nm and 120 nm.

In an exemplary embodiment, the substrate includes a first substrate layer away from the outer connection wiring, a second substrate layer adjacent to the outer connection wiring, and a water oxygen barrier layer located between the first substrate layer and the second substrate layer.

In an exemplary embodiment, the array substrate has a non-display area, and the via hole is located in the non-display area.

In an exemplary embodiment, the array substrate further includes a buffer layer, and the outer connection wiring is located below the buffer layer.

A method for manufacturing an array substrate is also provided in the present disclosure.

A method for manufacturing an array substrate includes:
forming a substrate;
forming an outer connection wiring on the substrate;
forming an inorganic film on the outer connection wiring;
etching the inorganic film to form a via hole and a groove;
forming a third metal layer on the inorganic film.

In the method for manufacturing the above array substrate, the array substrate obtained has no inorganic film above the outer connection section of the outer connection wiring. Compared with the case where the entire metal wiring is located on the inorganic film, the outer connection wiring is less squeezed during bending, which is advantageous for reducing the stress of the outer connection wiring and avoiding the breakage of the outer connection wiring. In addition, the outer connection wiring and the third metal layer are connected through the via hole to avoid the risk of disconnection caused by the height difference.

In an exemplary embodiment, forming the outer connection wiring on the substrate includes:
depositing a metal layer, covering the metal layer with photoresist, forming the outer connection wiring by means of exposure, development and etching, and removing the photoresist after the etching is completed.

In an exemplary embodiment, the method further includes covering the substrate with a barrier layer prior to forming the outer connection wiring.

In an exemplary embodiment, the method further includes forming a buffer layer covering the outer connection wiring and the barrier layer after forming the outer connection wiring.

A display screen is further provided in the present disclosure.

The display screen includes the array substrate provided by the present disclosure.

In the above display, due to employing the array substrate provided in the present disclosure, the pressure applied on the metal wiring is reduced, thereby avoiding breakage of the metal wiring and improving reliability of the array substrate. Thus the yield of the screen is improved finally.

DETAILED DESCRIPTION OF THE INVENTION

Conventional manufacturing processes of displays usually involve bending non-display areas, which can result in breaking the films and metal wirings within the non-display areas.

In order to make the objects, technical solutions and advantages of the present disclosure more clear, the present disclosure will be further described in detail below in conjunction with the specific exemplary embodiments. It is understood that the specific exemplary embodiments described herein are merely illustrative of the disclosure and are not intended to limit the present disclosure.

All technical and scientific terms used herein have the same meaning as commonly understood by one of ordinary skill in the art to which this disclosure applies, unless otherwise defined. The terminology used herein is for the purpose of describing particular exemplary embodiments, and is not intended to limit the present disclosure. The term "and/or" used herein includes any and all combinations of one or more of the associated listed items.

In an exemplary embodiment, provided is an array substrate having a display area and a non-display area located outside of the display area.

Figure 1:
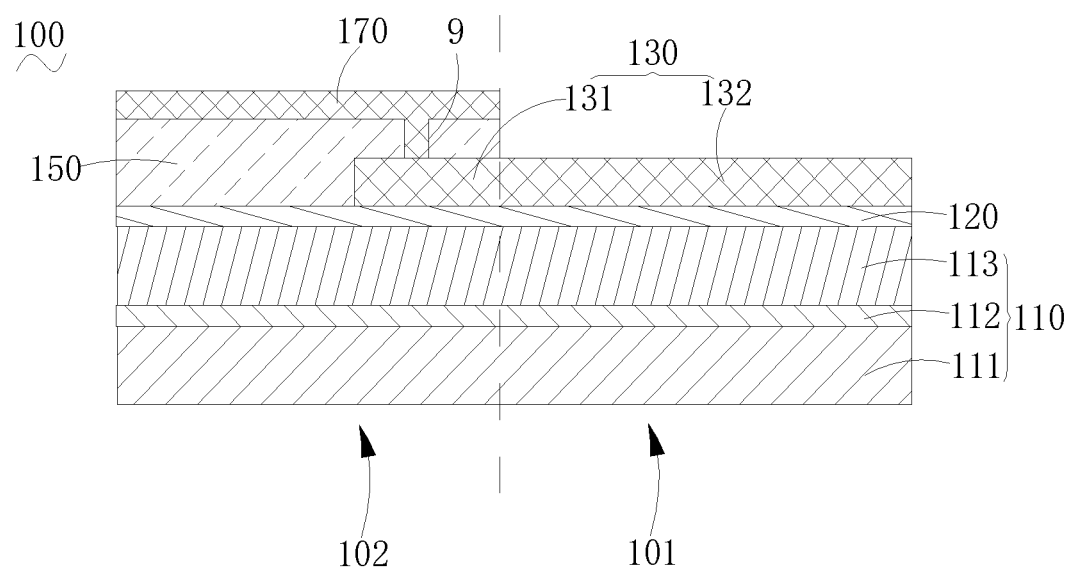
FIG. 1 is a structural schematic diagram illustrating a cross-section of a non-display area of an array substrate according to an exemplary embodiment.

Referring to FIG. 1, FIG. 1 is a structural schematic diagram illustrating a cross-section of a non-display area of an array substrate according to an exemplary embodiment. In this exemplary embodiment, the specific structure of the display area of the array substrate can be understood by referring to the non-display area and FIG. 1. A person skilled in the art can select an appropriate specific structure of the display area according to actual conditions without affecting the structure of the non-display area (for example, films of both the display area and the non-display area), and details are not described herein.

In the non-display area, the array substrate 100 includes a substrate 110, a barrier layer 120 formed on the substrate 110, an outer connection wiring 130 formed on the barrier layer 120, an inorganic film 150 covering the outer connection wiring 130, and a third metal layer 170 formed on the inorganic film 150.

The main function of the substrate 110 is to provide support for the layers formed thereon. It can be understood that the substrate 110 is provided in both the display area and the non-display area of the array substrate 100.

In this exemplary embodiment, the substrate 110 includes a first substrate layer 111, a water oxygen barrier layer 112, and a second substrate layer 113. The first substrate layer 111 is located on a side of the substrate 110 away from the barrier layer 120, the second substrate layer 113 is located on a side of the substrate 110 adjacent to the barrier layer 120, and the water and oxygen barrier layer 112 is located between the first substrate layer 111 and the second substrate layers 113. Since the water oxygen barrier layer 112 is added to the configuration of the substrate, water or oxygen can be further prevented from entering, and the water-oxygen barrier ability of the entire display screen can be improved.

The main function of the barrier layer 120 is to prevent the substrate 110 from contaminating the chamber when the outer connection wiring 130 is formed. It can be understood that the barrier layer 120 is provided in both the display area and the non-display area of the array substrate 100.

Preferably, the barrier layer 120 is an silicon oxide layer. Such barrier layer can also play a role in blocking moisture from entering the thin film transistor while making the stress between the layers more closely matched. Of course, it can be understood that the barrier layer 120 is not limited thereto, and may be other barrier layers that are considered to be suitable by those skilled in the art, such as a silicon nitride layer or a silicon oxynitride layer.

Preferably, the thickness of the barrier layer 120 is between 80 nm and 120 nm, so that when the array substrate is bent, the thickness of the barrier layer 120 (generally with a higher hardness) under the outer connection wiring 130 is further reduced. In this way, the pressing force applied on the outer connection wiring 130 is further reduced and the breakage of the outer connection wiring 130 is avoided.

Of course, it can be understood that the barrier layer 120 may not be provided in other exemplary embodiments.

The main function of the outer connection wiring 130 is to transmit a signal to lead the signal out of the display screen. In an exemplary embodiment, the outer connection wiring 130 is located on the barrier layer 120. Compared with the case where the entire metal wiring is located on the inorganic film, the film under the outer connection wiring 130 is thinner, and the outer connection wiring 130 is less squeezed by the lower film, which is advantageous for reducing the stress of the outer connection wiring 130 and avoiding the breakage of the outer connection wiring 130.

Figure 2:
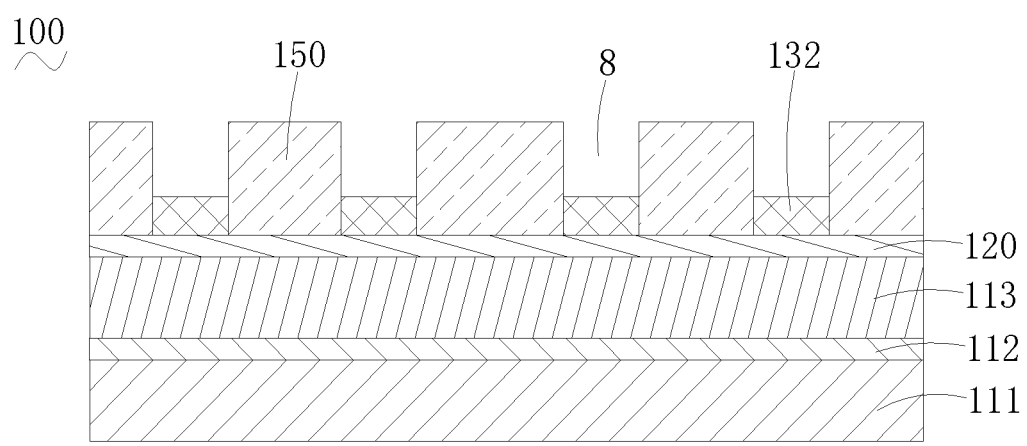
FIG. 2 is a structural schematic diagram illustrating a partial cross-section of the array substrate in FIG. 1.

Referring to FIG. 2 in combination, in particular, the outer connection line 130 includes a wire changing section 131 and an outer connection section 132, and the wire changing section 131 is located on an inner side of the outer connection section 132. The outer connection section 132 is a core section of the outer connection wiring 130 for leading the signal out. The main function of the wire changing section 131 is to make electrical contact with the metal wiring to implement cross-layer wire changing, and thus the signal from the third metal layer 170 is transmitted to the outer connection wiring 130 below the inorganic film 150.

The outer connection wiring may be made in a separate step. Of course, it can be understood that, for the simplicity of the process, the outer connection wiring may also be made together with other metal layers in the display area, that is, the outer connection wiring and the metal layer of the display area may be made by a same process. The metal layer of the display area known in the art includes a first metal layer and a second metal layer, that is, the outer connection wiring may be made together with the first metal layer, or may be made together with the second metal layer.

For convenience of description, the area where the wire changing section 131 is located is artificially defined as the wire changing area 102, and the area where the outer connection section 132 is located is defined as the bending area 101.

Preferably, the outer connection wiring 130 has a thickness between 500 nm and 1,000 nm. This can reduce the resistance of the outer connection wiring 130 and also facilitate the deposition of the outer connection wiring 130.

The inorganic film 150 is an insulating layer used for the thin film transistor and the capacitor in the array substrate 100. Generally, the inorganic film 150 includes an interlayer dielectric layer (ILD layer), a dielectric layer (CI layer), and a gate insulating layer (GI layer) from top to bottom. Of course, it can be understood that the specific structure of the inorganic film can be adaptively changed according to the specific structure of the display area, and is not limited to the form above mentioned.

A via hole 9 and a groove 8 are provided in the inorganic film 150.

The main function of the via hole 9 is to expose a part of the wire changing section 131 so that the metal layer (M3 layer) on the inorganic film 150 and the wire changing section 131 are connected to each other through the via hole 9. That is, the via hole 9 is located at the wire changing area 102 of the inorganic film 150. The inorganic film 150 covers almost all of the wire changing area 102.

Referring primarily to FIG. 2, the primary function of the groove 8 is to expose the outer connection area 132. That is, the groove 8 is located in the bending area 101. In the bending area 101, the inorganic film 150 covers only the portion without the outer connection section 132. Thus, there is no inorganic film 150 above the outer connection section 132, so that when the array substrate is bent, the inorganic film 150 is prevented from being pressed against the outer connection section 132, thereby reducing the stress and avoiding the breakage of the outer connection section 132.

The third metal layer 170 is formed on the inorganic film 150. The third metal layer 170 is electrically connected to the wire changing section 131 through the via hole 9. It can be understood that the third metal layer 170 is only located in the wire changing area 102, and there is no third metal layer 170 in the bending area 101. In addition, the outer connection wiring 130 and the third metal layer 170 are connected through the via hole 9 to avoid the risk of disconnection caused by the height difference.

In this exemplary embodiment, the outer connection wiring 130 is only located in the non-display area, that is, the wire changing section 131 of the outer connection wiring 130 does not extend into the display area. Correspondingly, the via hole 9 is located in the non-display area.

It can be understood that in other exemplary embodiments, the outer connection wiring 130 may be provided in both the non-display area and the display area. That is, the wire changing section 131 may extend into the display area. In this case, the via hole 9 may be located in the non-display area, and the wire changing may be implemented in the non-display area (that is, the wire changing section 131 in FIG. 1 may extend leftwards and into the display area). The via hole 9 may also be located in the display area, and the line changing may be realized in the display area. In this case, it can be understood that the via hole 9 does not affect the normal operation of the display area, and the via hole 9 is located in a position of the display area away from the TFT and the capacitor (for convenience of understanding, the wire changing area in FIG. 2 can be considered as a part of the display area).

In another exemplary embodiment, the array substrate further includes a buffer layer covering the outer connection wiring 130. Correspondingly, the via hole 9 not only passes through the inorganic film 150 but also passes through the buffer layer to expose the wire changing section 131.

In the above array substrate, the outer connection wiring 130 is located on the barrier layer 120. Compared with the case where the metal wiring is on the inorganic film, the present film under the outer connection wiring 130 is thinner, and the outer connection wiring 130 is less pressed by the lower film, which is advantageous for reducing the stress of the outer connection wiring 130 and preventing the breakage of the outer connection wiring 130. At the same time, there is no inorganic film 150 above the outer connection section 132, so that when the array substrate is bent, the inorganic film 150 is prevented from pressing against the outer connection section 132, thereby reducing the stress, and preventing the breakage of the outer connection section 132. In addition, the outer connection wiring and the metal layer are connected through the via hole to avoid the risk of disconnection caused by the height difference.

A method for manufacturing an array substrate is further provided in the present disclosure.

A method for manufacturing an array substrate includes the following steps:

S1, forming a substrate, forming a barrier layer on the substrate;

S2, forming an outer connection wiring on the barrier layer;

S3, forming an inorganic film on the outer connection wiring and the barrier layer;

S4, etching an inorganic film to form an via hole, and a groove; and

S5, forming a metal layer on the inorganic film.

The forming the barrier layer in the step S1 may be implemented by various methods for forming the barrier layer as considered to be suitable by those skilled in the art, and details are not described herein. It can be understood that the step S1 may not be included in other exemplary embodiments, that is, no barrier layer is formed.

The forming the outer connection wiring in the step S2 may include: depositing a metal layer on the barrier layer, covering the metal layer with photoresist, forming the outer connection wiring by means of exposure, development and etching, and removing the photoresist after etching is completed. That is to say, the formation of the outer connection wiring is a complete PEP process.

The main purpose of the step S3 is to form an inorganic film. It can be understood that, in the step S3, in addition to forming the inorganic film in the display area and non-display area, other steps may be performed, for example, a channel area of amorphous silicon, a source area, a drain area, a first metal layer (M1 layer) and a second metal layer (M2 layer) may be formed in the display area. That is, the step S3 is to form a main portion of the thin film transistor and a capacitor. The specific step of the step S3 may be implemented by various methods that are considered to be suitable by those skilled in the art, and are not described herein.

The step S4 is substantially the same as the step of etching the inorganic film in the prior art, except that the design pattern of the etching is different, and the patterns of the via hole and the groove are added. Other steps may be performed by various methods considered to be suitable by those skilled in the art.

In the step S5, a third metal layer (M3 layer) is formed, and various methods of forming the third metal layer (M3 layer) that are considered to be suitable by those skilled in the art may be adopted.

Preferably, in the case where the array substrate has a buffer layer, the buffer layer is formed after the formation of the outer connection wiring and before the formation of the amorphous silicon layer. The buffer layer covers the outer connection wiring and the barrier layer.

In the method for manufacturing the array substrate according to the present disclosure, the steps of the prior art may be used, but for the additional step of forming the outer connection wiring after the barrier layer is formed, and changing the design pattern during the etching.

For the process of forming a metal wiring by depositing a third metal layer after etching the inorganic film in the non-display area, the process has the risk of etching the substrate layer during etching because the composition of the inorganic film and the underlying barrier layer are similar, and subsequent deposition of the metal film will cause pollution. However, in the method according to the present disclosure, the chamber is protected by the barrier layer under the outer connection wiring during the formation of the outer connection wiring, there is no risk of contaminating the chamber. In addition, the inorganic film is blocked by the outer connection wiring during etching, and the substrate layer will not be etched, so that there is no risk of contaminating the chamber.

A display screen is further provided in the present disclosure.

The display screen includes the array substrate provided by the present disclosure.

It can be understood that the display screen includes other devices in addition to the array substrate, and the specific configurations of the other devices and the connection relationships between the devices may adopt configurations well known to those skilled in the art, and details are not described herein.

In the above display screen, due to employing the array substrate provided by the present disclosure, the pressure applied on the outer connection wiring is reduced, thereby avoiding the breakage of the outer connection wiring and improving the reliability of the array substrate. Thus the yield of the screen is improved finally.

Technical features of the above exemplary embodiments may be arbitrarily combined. For brief description, not all possible combinations of the technical features in the above exemplary embodiments are described. However, as long as combinations of the technical features are not contradicted, the combinations should be considered as belonging to the scope of this disclosure.

The above-mentioned exemplary embodiments are merely illustrative of several exemplary embodiments of the present disclosure, and the description thereof is more specific and detailed, but is not to be construed as limiting the scope of the claims. It should be noted that a number of variations and modifications may be made by those skilled in the art without departing from the spirit and scope of the present disclosure. Therefore, the scope of protection of the disclosure should be determined by the appended claims.

The invention claimed is:

1. An array substrate, comprising:
a substrate;
an outer connection wiring formed on the substrate;
an inorganic film covering the outer connection wiring; and
a third metal layer formed on the inorganic film, the third metal layer being connected to the outer connection wiring, wherein:
the outer connection wiring comprises an outer connection section and a wire changing section located on an inner side of the outer connection section;
the inorganic film is provided with a via hole exposing a part of the wire changing section, and a groove exposing the outer connection section; and
the third metal layer comprises a third metal wiring electrically connected to the wire changing section through the via hole.

2. The array substrate according to claim 1, further comprising a barrier layer formed between the outer connection wiring and the substrate.

3. The array substrate according to claim 2, wherein, the barrier layer comprises silicon oxide or silicon nitride or silicon oxynitride.

4. The array substrate according to claim 1, wherein the outer connection wiring has a thickness between 500 nm and 1,000 nm.

5. The array substrate according to claim 2, wherein the barrier layer has a thickness between 80 nm and 120 nm.

6. The array substrate according to claim 1, wherein the substrate comprises a first substrate layer away from the outer connection wiring, a second substrate layer adjacent to the outer connection wiring, and a water oxygen barrier layer located between the first substrate layer and the second substrate layer.

7. The array substrate according to claim 1, wherein the array substrate has a non-display area, and the via hole is located in the non-display area.

8. The array substrate according to claim 1, wherein the array substrate further comprises a buffer layer, and the outer connection wiring is located below the buffer layer.

9. A display screen, comprising the array substrate according to claim 1.

10. A method for manufacturing an array substrate, comprising:
forming a substrate;
covering the substrate with a barrier layer;
forming an outer connection wiring on the substrate;
forming an inorganic film on the outer connection wiring;
etching the inorganic film to form a via hole and a groove; and
forming a third metal layer on the inorganic film.

11. The method according to claim 10, wherein forming the outer connection wiring on the substrate comprises:
depositing a metal layer, covering the metal layer with photoresist, forming the outer connection wiring by means of exposure, development and etching, and removing the photoresist after the etching is completed.

12. The method according to claim 10, further comprising forming a buffer layer covering the outer connection wiring and the barrier layer after forming the outer connection wiring.

13. An array substrate, comprising:
a substrate;
an outer connection wiring formed on the substrate;
an inorganic film covering the outer connection wiring; and
a third metal layer formed on the inorganic film, the third metal layer being connected to the outer connection wiring,
wherein the array substrate further comprises a buffer layer, and the outer connection wiring is located below the buffer layer.

14. The array substrate according to claim 13, wherein:
the outer connection wiring comprises an outer connection section and a wire changing section located on an inner side of the outer connection section;
the inorganic film is provided with a via hole exposing a part of the wire changing section, and a groove exposing the outer connection section; and
the third metal layer comprises a third metal wiring electrically connected to the wire changing section through the via hole.

15. The array substrate according to claim 13, further comprising a barrier layer formed between the outer connection wiring and the substrate.

16. The array substrate according to claim 15, wherein, the barrier layer comprises silicon oxide or silicon nitride or silicon oxynitride.

17. The array substrate according to claim 15, wherein the barrier layer has a thickness between 80 nm and 120 nm.

18. The array substrate according to claim 13, wherein the substrate comprises a first substrate layer away from the outer connection wiring, a second substrate layer adjacent to the outer connection wiring, and a water oxygen barrier layer located between the first substrate layer and the second substrate layer.

* * * * *